(12) United States Patent
Guevara et al.

(10) Patent No.: US 12,319,563 B2
(45) Date of Patent: Jun. 3, 2025

(54) SEMICONDUCTOR PACKAGE WITH METAL COLUMN MOLD BARRIER

(71) Applicant: TEXAS INSTRUMENTS INCORPORATED, Dallas, TX (US)

(72) Inventors: Rafael Jose Lizares Guevara, Makati (PH); James Raymond Maliclic Baello, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 413 days.

(21) Appl. No.: 17/345,707

(22) Filed: Jun. 11, 2021

(65) Prior Publication Data

US 2022/0396474 A1    Dec. 15, 2022

(51) Int. Cl.
B81C 1/00    (2006.01)
B81B 7/00    (2006.01)
G01N 27/22    (2006.01)

(52) U.S. Cl.
CPC ........ B81B 7/0061 (2013.01); B81C 1/00309 (2013.01); G01N 27/223 (2013.01); B81B 2201/0214 (2013.01); B81B 2207/07 (2013.01); B81B 2207/098 (2013.01); B81C 2203/0154 (2013.01)

(58) Field of Classification Search
CPC ................... B81C 1/00309; B81C 2203/0154
See application file for complete search history.

(56) References Cited

U.S. PATENT DOCUMENTS

| | | | |
|---|---|---|---|
| 6,441,503 B1* | 8/2002 | Webster | G01L 19/147 257/E21.504 |
| 6,987,312 B2 | 1/2006 | Theuss | |
| 8,169,058 B2 | 5/2012 | Pagaila et al. | |
| 9,640,504 B2 | 5/2017 | Pagaila et al. | |
| 9,663,357 B2 | 5/2017 | Mao et al. | |
| 10,077,186 B2 | 9/2018 | Shibuya et al. | |
| 10,179,730 B2 | 1/2019 | Male et al. | |
| 10,734,313 B2 | 8/2020 | Morroni et al. | |
| RE48,408 E | 1/2021 | Pagaila et al. | |
| 2005/0046044 A1* | 3/2005 | Theuss | G01L 19/147 257/E31.117 |
| 2010/0043530 A1* | 2/2010 | Elian | H01L 23/49575 73/31.06 |
| 2011/0059275 A1* | 3/2011 | Stark | H01L 23/10 428/34 |
| 2017/0081175 A1* | 3/2017 | Steiert | B81C 1/00301 |
| 2020/0168530 A1 | 5/2020 | Male et al. | |
| 2021/0091012 A1 | 3/2021 | Cook et al. | |
| 2021/0134750 A1 | 5/2021 | Manack et al. | |

* cited by examiner

Primary Examiner — Moazzam Hossain
(74) Attorney, Agent, or Firm — Dawn Jos; Frank D. Cimino (57) ABSTRACT

A semiconductor package includes a semiconductor die including terminals, a plurality of leads, at least some of the leads being electrically coupled to the terminals within the semiconductor package, a sensor on a surface of the semiconductor die, a set of metal columns on the surface of the semiconductor die, the set of metal columns forming a perimeter around the sensor on the surface of the semiconductor die, and a mold compound surrounding the semiconductor die except for an area inside the perimeter on the surface of the semiconductor die such that the sensor is exposed to ambient air.

15 Claims, 7 Drawing Sheets

SEMICONDUCTOR PACKAGE WITH METAL COLUMN MOLD BARRIER

TECHNICAL FIELD

This disclosure relates to semiconductor packages.

BACKGROUND

Electronic package technology continues trends towards miniaturization, integration, and speed. Semiconductor packages provide support for an integrated circuit (IC) chip or semiconductor die and associated bond wires, provide protection from the environment, and enable surface-mounting of the die to and interconnection with an external component, such as a printed circuit board (PCB). Lead-frame semiconductor packages are well known and widely used in the electronics industry to house, mount, and interconnect a variety of ICs.

A conventional leadframe is typically die-stamped from a sheet of flat-stock metal and includes a plurality of metal leads temporarily held together in a planar arrangement about a central region during package manufacture by siderails forming a rectangular frame. A mounting pad for a semiconductor die is supported in the central region by "tie-bars" that attach to the frame. The leads extend from a first end integral with the frame to an opposite second end adjacent to, but spaced apart from, the die pad. As alternatives to a conventional leadframe, routable leadframes include at least one metal layer supported by a dielectric layers, such as laminate films and/or premolded dielectric layers.

In a semiconductor sensor package, a semiconductor die includes a sensor adapted to sense a physical parameter of the surroundings of the semiconductor sensor package. For example, in a capacitive-type humidity sensor a thin polymer film is attached to a surface of a semiconductor die and is connected to electrical circuitry within the die. Changes in humidity affect the amount of moisture absorbed by the polymer film. Moisture absorption causes a change in the capacitance of the film. This change in capacitance is measured by the die circuitry and is representative of the humidity of the air. To make such a semiconductor sensor package, the polymer film attached to the die must be exposed to the surrounding air.

BRIEF SUMMARY

Packages disclosed herein include metal columns extending from a semiconductor die. The metal columns serve as a mold barrier to leave a portion of the semiconductor die uncovered by package mold compound. The techniques disclosed herein may be incorporated into semiconductor sensor packages to expose a sensor on the semiconductor die to the surrounding air.

In one example, a semiconductor package includes a semiconductor die including terminals; a plurality of leads, at least some of the leads being electrically coupled to the terminals within the semiconductor package, a sensor on a surface of the semiconductor die, a set of metal columns on the surface of the semiconductor die, the set of metal columns forming a perimeter around the sensor on the surface of the semiconductor die, and a mold compound surrounding the semiconductor die except for an area inside the perimeter on the surface of the semiconductor die such that the sensor is exposed to ambient air.

In a further example, a method of forming a package includes soldering a set of metal columns on a surface of a semiconductor die to form a perimeter around a sensor on the surface of the semiconductor die, electrically coupling terminals of the semiconductor die to a plurality of leads, and molding a mold compound over the semiconductor die except for an area inside the perimeter on the surface of the semiconductor die such that the sensor is exposed to ambient air.

DETAILED DESCRIPTION

Figure 1A:
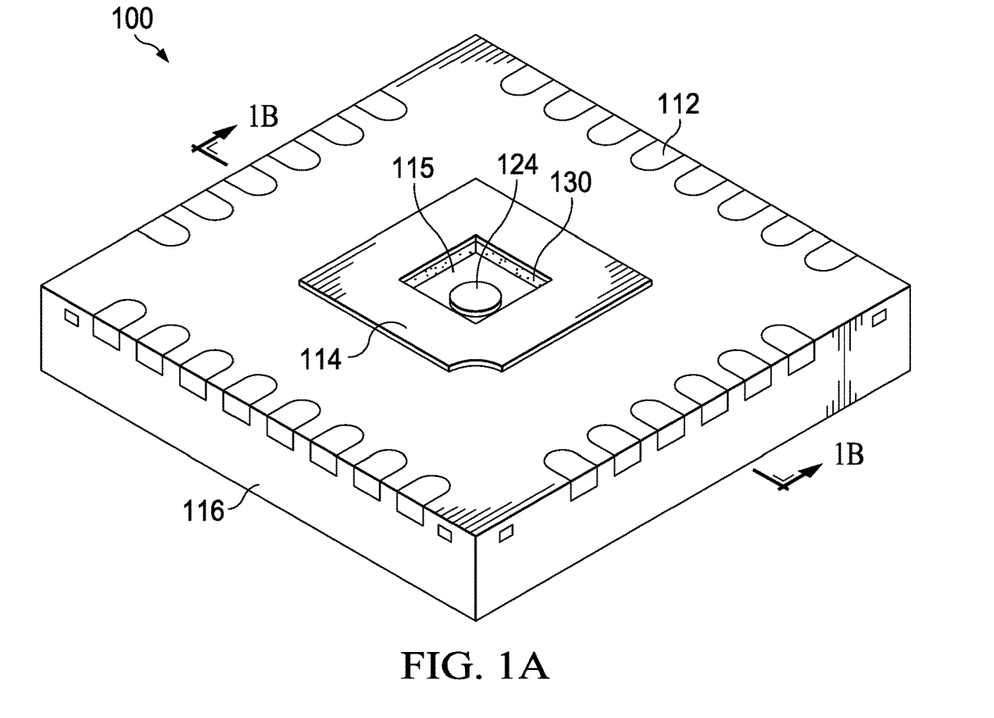
FIGS. 1A and 1B illustrate a semiconductor package including a set of metal columns forming a perimeter around a sensor on the surface of a semiconductor die.
Figure 1B:
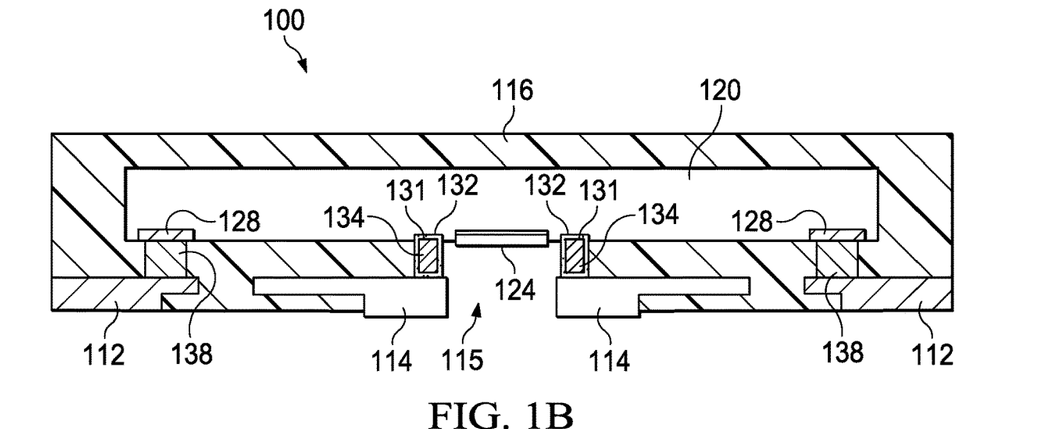

FIGS. 1A and 1B illustrate semiconductor package 100. Specifically, FIG. 1A illustrates a perspective view of semiconductor package 100, and FIG. 1B illustrates a cross-sectional view of semiconductor package 100. Semiconductor package 100 includes a semiconductor die 120 including terminals 128, a plurality of leads 112, at least some of the leads 112 being electrically coupled to the terminals 128 within the semiconductor package 100, and a sensor 124 on a surface of the semiconductor die 120. Semiconductor package 100 further includes a set of metal columns 130 forming a perimeter around sensor 124 on the active surface of a semiconductor die 120. Mold compound 116 surrounds the semiconductor die 120 except for an area inside the perimeter on the surface of the semiconductor die 120 such that the sensor 124 is exposed to ambient air. Metal columns 130 serve as a mold barrier to leave sensor 124 uncovered by package mold compound 116.

The active surface of semiconductor die 120 is bonded to leadframe 111 (FIG. 2G) with metal pillars 138 in electrical contact with the plurality of leads 112, and metal columns 130 bonded to die pad 114. Metal columns 130 extend between the semiconductor die 120 and die pad 114 and function as a mold block to prevent mold compound 116 from covering sensor 124 during the manufacturing of package 100.

As shown in FIG. 1B, metal columns 130 include a solder layer 131 covering all sides of metal column base metal sections 134. For example, the base metal sections 134 may be an alloy predominantly including one or more of copper, aluminum, iron, and/or gold. As referred to herein, predominantly including means at more than fifty percent by weight. Solder layer 131 is a conductive material such as Al, Cu, Sn, Ni, Au, Ag, titanium (Ti), tungsten (W), solder, poly-silicon, or combination thereof. Solder layer 131 mechanically joins the base metal sections 134 end to end. Solder layer 131 also mechanically joins the base metal sections 134 to both semiconductor die 120 and die pad 114.

Die pad 114 includes a through hole 115 that accesses sensor 124 to expose sensor 124 to ambient air. In various examples, sensor 124 may include a pressure sensor, a humidity sensor and/or a dewpoint sensor.

Semiconductor die 120 comprises a substrate (e.g., silicon or silicon/germanium) having an active surface and an inactive surface. Die terminals 128 are exposed in bond pad openings in a dielectric layer of semiconductor die 120 on its active surface. Die terminals 128 are bonded to a metallization layer including functional circuitry (not shown) in a semiconductor substrate beneath an outer dielectric layer. Likewise, groove 132 represents an opening in the outer dielectric layer on the active surface of semiconductor die. Metal columns 130 are mechanically attached to a metallization layer of semiconductor die 120 within groove 132 with solder layer 131. Metal columns 130 may optionally be electrically connected to a grounded electrical potential by way of their attachment to the metallization layer of semiconductor die 120. In turn, die pad 114 may also be electrically connected to the grounded electrical potential by way of attachment to the metal columns 130.

The functional circuitry of semiconductor die 120 is formed on a semiconductor wafer prior to singulation of semiconductor die 120 and includes circuit elements forming sensor 124, such as transistors, diodes, capacitors, and resistors, as well as signal lines and other electrical conductors that interconnect the various circuit elements. As non-limiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Semiconductor package 100 is manufactured using two complex manufacturing processes, i.e., front-end manufacturing and back-end manufacturing, each involving potentially hundreds of steps. Front-end manufacturing involves the formation of a plurality of semiconductor dies 120 on the surface of a semiconductor wafer. Each die is typically identical and contains circuits formed by electrically connecting active and passive components. Back-end manufacturing involves singulating individual semiconductor dies 120 from the finished wafer and packaging the die to provide structural support and environmental isolation.

Conventional leadframes, such as leadframe 111 (FIG. 2G), are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to leadframe attachment, such as solder reflowing, wire bonding or metal trace patterning, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe of represents the portions of the leadframe strip remaining within a package after singulation. With respect to semiconductor package 100, leadframe 111 (FIG. 2G) includes leads 112, a portion of tie bars 113, and die pad 114, although those conductive elements are not directly interconnected following singulation of semiconductor package 100.

Mold compound 116 provides a protective layer covering electronics of semiconductor package 100, including semiconductor die 120 and metal pillars 138. Mold compound 116 may be formed from a nonconductive plastic or resin material. Suitable mold compounds include, for example, thermoset compounds that include an epoxy novolac resin or similar material combined with a filler, such as alumina, and other materials to make the compound suitable for molding, such as accelerators, curing agents, filters, and mold release agents. Further details regarding the structure and function of semiconductor package 100 provided in FIGS. 2A-2G and the corresponding description.

Figure 3A:
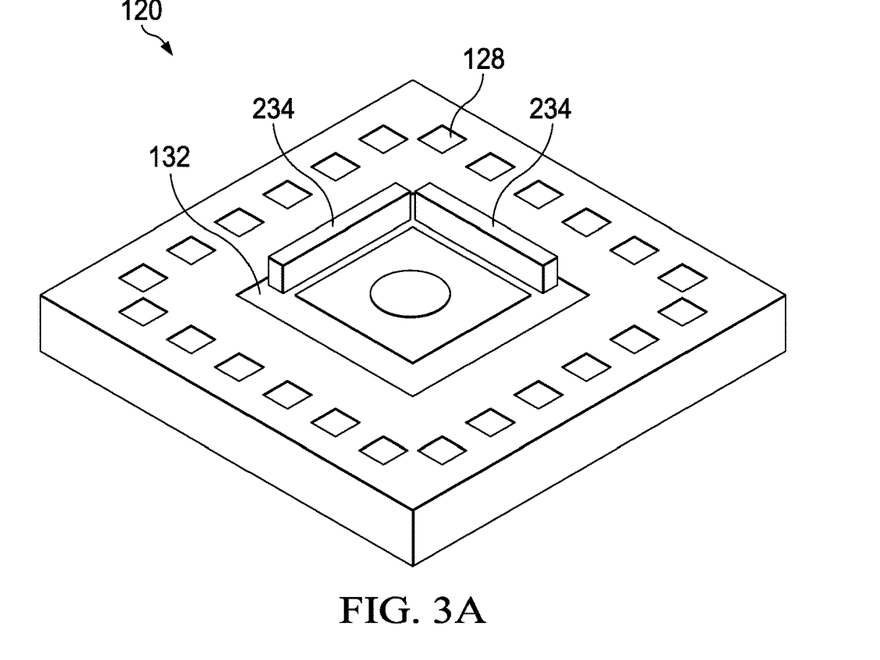
FIGS. 3A-3B illustrate an alternative to the conceptual process steps of FIGS. 2C and 2D.
Figure 3B:
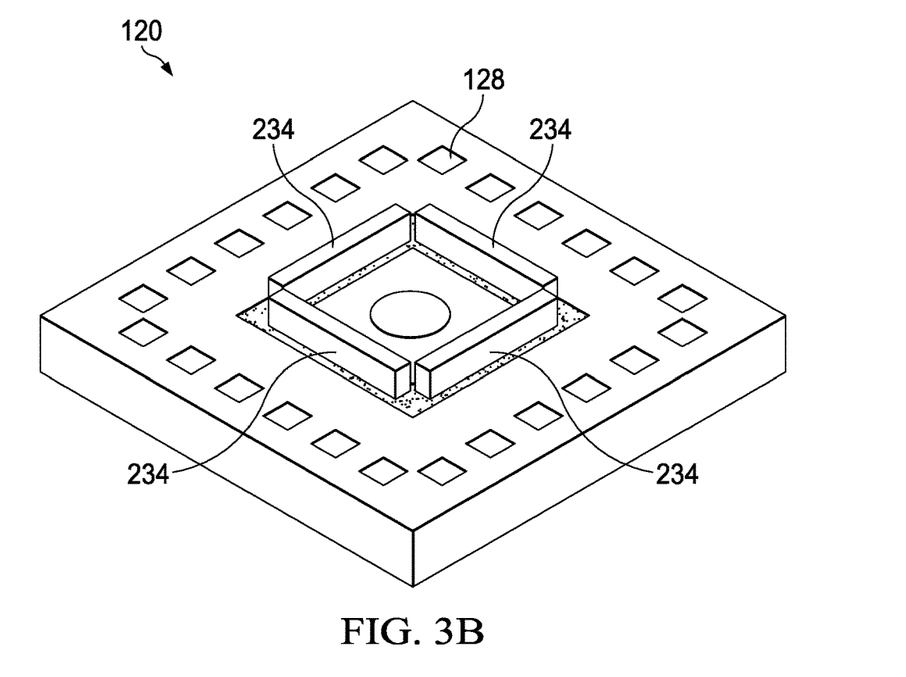
Figure 4:
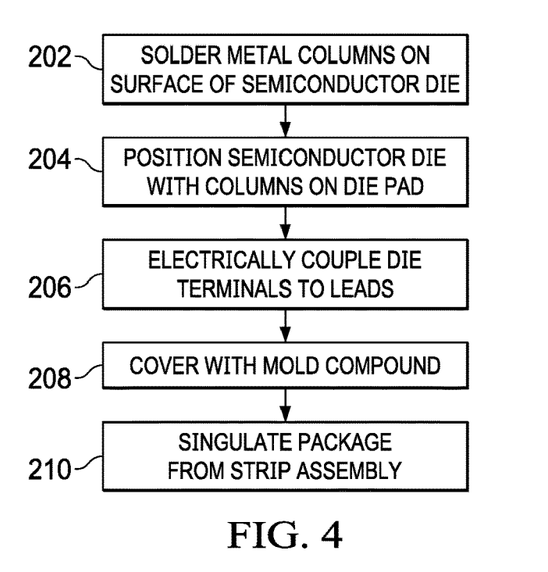
FIG. 4 is flowchart of a method of manufacturing a semiconductor package including a set of metal columns forming a perimeter around a sensor on the surface of a semiconductor die, such as the package of FIGS. 1A and 1B.

FIGS. 2A-2G illustrate conceptual process steps for manufacturing semiconductor package 100. FIGS. 3A-3B illustrate an alternative to the conceptual process steps illustrated in FIGS. 2C and 2D. FIG. 4 is flowchart of a method of manufacturing a semiconductor package including a set of metal columns forming a perimeter around a sensor on the surface of a semiconductor die, such as semiconductor package 100. For clarity, the techniques of FIG. 4 are described with respect to semiconductor package 100 and FIGS. 2A-3B; however, the described techniques may also be readily adapted to alternative package configurations.

Figure 2A:
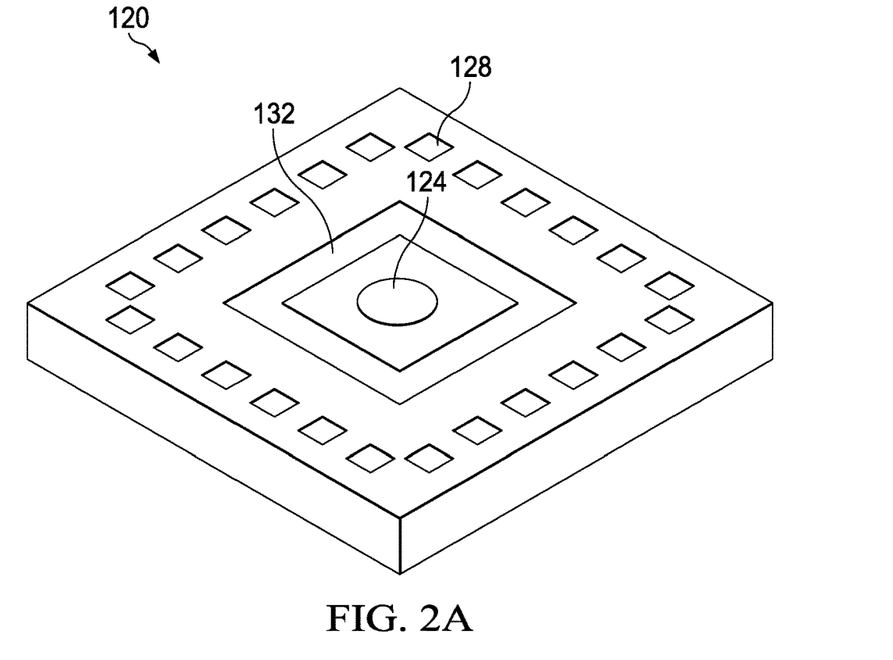
FIGS. 2A-2H illustrate conceptual process steps for manufacturing the package of FIGS. 1A and 1B.

FIG. 2A illustrates a perspective view of semiconductor die 120. Semiconductor die 120 includes an active surface with sensor 124, terminals 128 and groove 132. Terminals 128 extend through an outer dielectric layer of semiconductor die 120 and include one or more layers of conductive material, such as aluminum (Al), copper (Cu), tin (Sn), nickel (Ni), gold (Au), or silver (Ag), and are electrically connected to the circuit elements formed within semiconductor die 120. Likewise, groove 132 represents an opening in the outer dielectric layer on the active surface of semiconductor die 120. While semiconductor die 120 is depicted in FIGS. 2A-2F as a singulated semiconductor die 120, these manufacturing steps, which occur prior to mounting semiconductor die 120 on leadframe 111 (FIG. 2G), may be performed either prior to or after singulation of semiconductor die 120 from the semiconductor wafer.

Figure 2B:
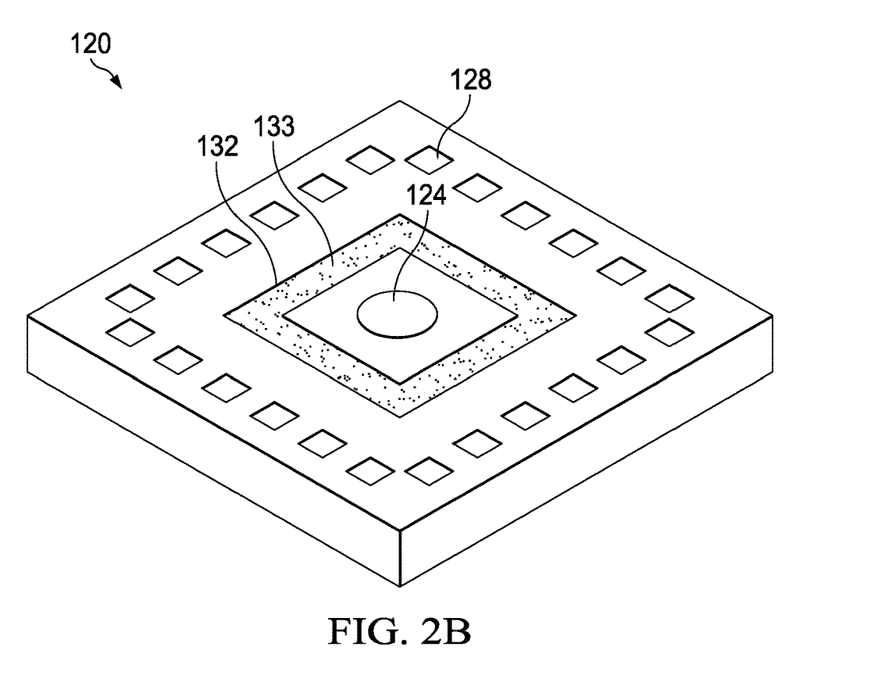

As show in FIG. 2B-2E, metal columns 130 are mechanically attached to a metallization layer of semiconductor die 120 within groove 132 with solder layer 131 (FIG. 4, step 202). As shown in FIG. 2B, soldering includes first plating solder 133 within groove 132 using a selective plating process. Solder 133 is a conductive material such as Al, Cu, Sn, Ni, Au, Ag, titanium (Ti), tungsten (W), solder, polysilicon, or combination thereof.

Figure 2C:
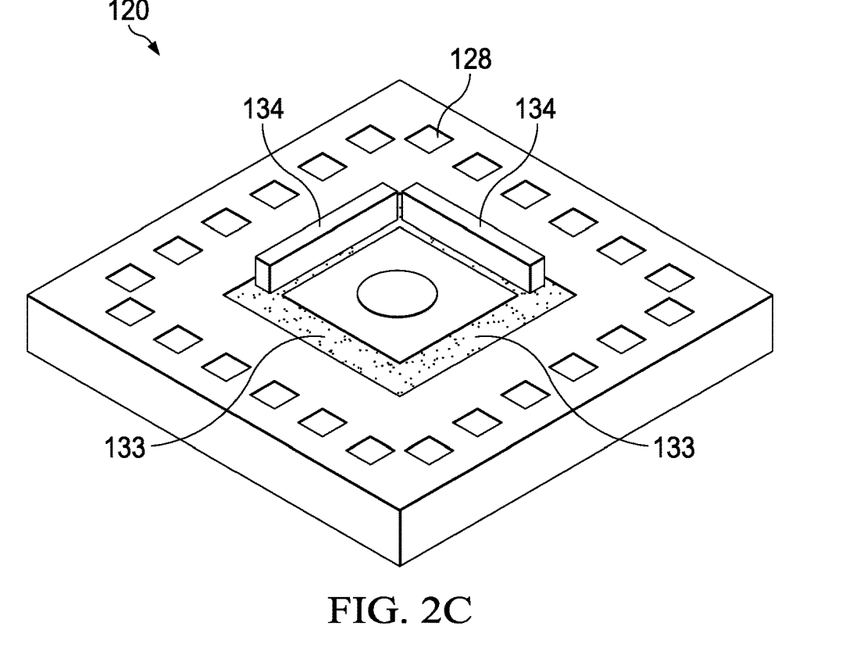
Figure 2D:
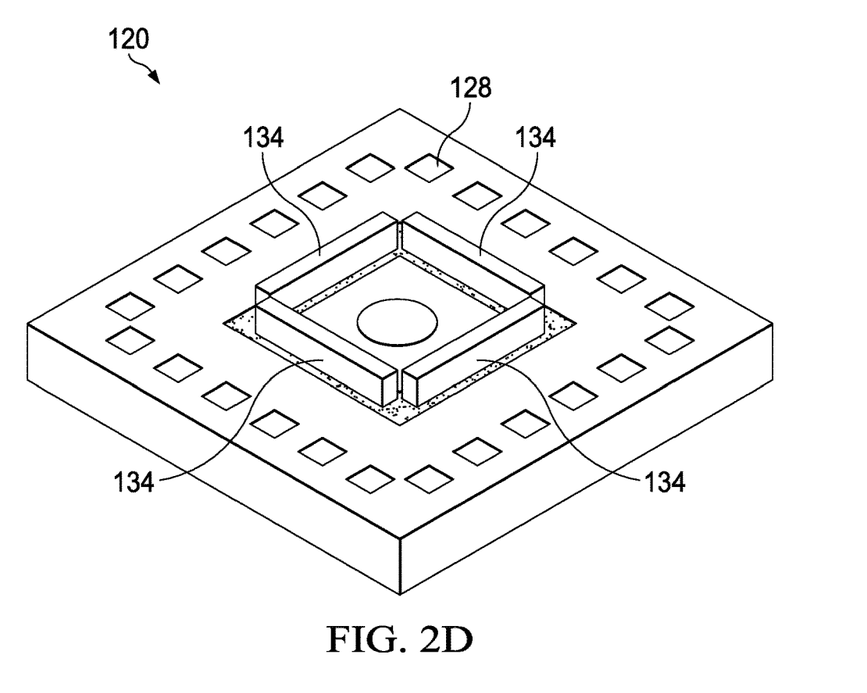

As shown in FIGS. 2C and 2D, four unsoldered metal column base metal sections 134 are placed end-to-end over plated solder 133 about the perimeter of sensor 124. Base metal sections 134 may be more planar, thereby better block mold compound as compared to using plating players to form metal columns 130. In other examples, columns 130 may be plated followed by grinding to provide suitable planarity for blocking mold compound from sensor 124.

Figure 2E:
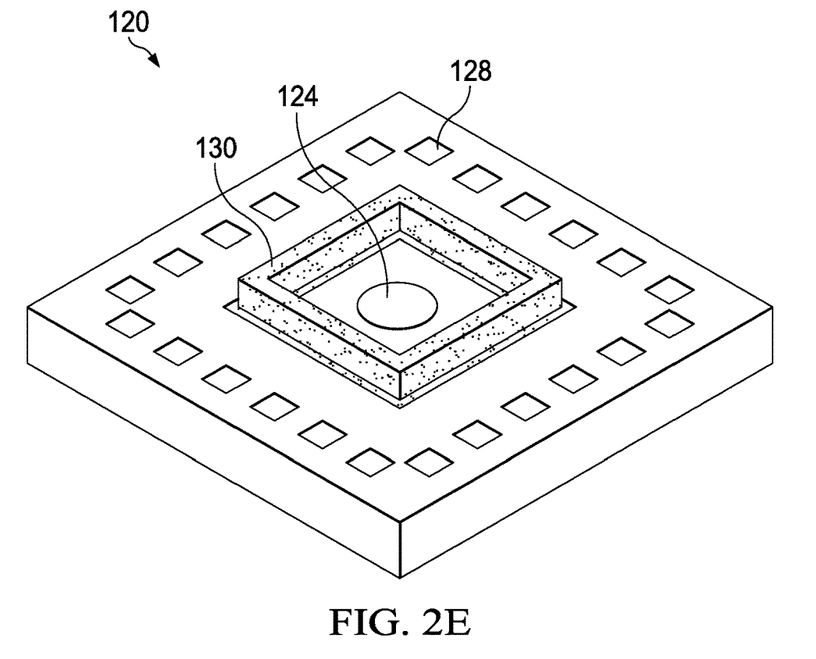

As shown in FIG. 2E, plated solder 133 is reflowed to cover unsoldered metal column base metal sections 134, connecting the base metal sections 134 end-to-end to close the perimeter around sensor 124, and connecting the base metal sections 134 to the die metallization layer within groove 132. The end-to-end placement of unsoldered metal column base metal sections 134 allows the solder reflow to bridge the gaps between the sections 134. For example, the ends of unsoldered metal column base metal sections 134 may be placed on the active surface of die 120 with gaps of less than 50 microns to provide solder bridging during solder reflow. Following the reflow, the individual metal column base metal sections 134 combine to form a solder set of metal columns 130 about the perimeter of sensor 124 (FIG. 2E).

The dimensions of individual unsoldered metal column base metal sections 134 may be selected according to the particular requirements of semiconductor die 120 and sensor 124. The length of each base metal section 134 is selected to form the perimeter of sensor 124 within groove 132. In some example, this length is over 100 microns, such as a length of 100-1000 microns. While package 100 includes four metal column base metal sections 134 forming a square perimeter, other examples may include more or less metal columns placed end to end to form a perimeter in any shape, with each side being formed by one or more columns. Possible shapes for the perimeter around sensor 124 on the surface of semiconductor die 120 include triangles, squares, rectangles, trapezoids, or other polygons.

In some examples, each base metal section 134 may have a width of at least 50 microns to ensure stability during molding, such as a width of 50-200 microns. The maximum width of each base metal section 134 is limited by available space on the surface of semiconductor die 120. Metal column base metal sections 134 provide a thermal bridge between die pad 114 and semiconductor die 120. For this reason, the width of metal column base metal sections 134 may be increased to support conductive cooling of semiconductor die 120 within the space constraints on the surface of semiconductor die 120.

In the same or different examples, each base metal section 134 may have a height of at least 50 microns, such as a height of 50-200 microns. The height of each base metal section 134 should be sufficient to facilitate mold flow between die pad 114 and semiconductor die 120. Larger heights may be suitable in some applications, but increasing the spacing between die pad 114 and semiconductor die 120 by increasing the height of unsoldered metal column base metal sections 134 reduces conductive cooling of semiconductor die 120 due to limited thermal conductivity of the mold compound.

FIGS. 3A-3B illustrate an alternative process to FIGS. 2B-2D. As shown in FIGS. 3A-3B, soldering metal columns 130 on a surface of a semiconductor die 120 to form a perimeter around a sensor 124 on the surface of the semiconductor die 120 instead includes placing presoldered metal column sections 234 on within groove 132. Metal column sections 234 include a base metal covered by a solder coating. For example, the base metal may be an alloy predominantly including one or more of copper, aluminum, iron, and/or gold. The solder coating is a conductive material such as Al, Cu, Sn, Ni, Au, Ag, titanium (Ti), tungsten (W), solder, poly-silicon, or combination thereof.

As shown in FIGS. 3A-3B, four presoldered metal column base metal sections 134 are placed end to end within groove 132 about the perimeter of sensor 124. In this alternative, the solder coatings of metal column sections 234 are reflowed to join metal column sections 234 end-to-end about perimeter of sensor 124 and to the die metallization layer within groove 132 (FIG. 2E).

Figure 2F:
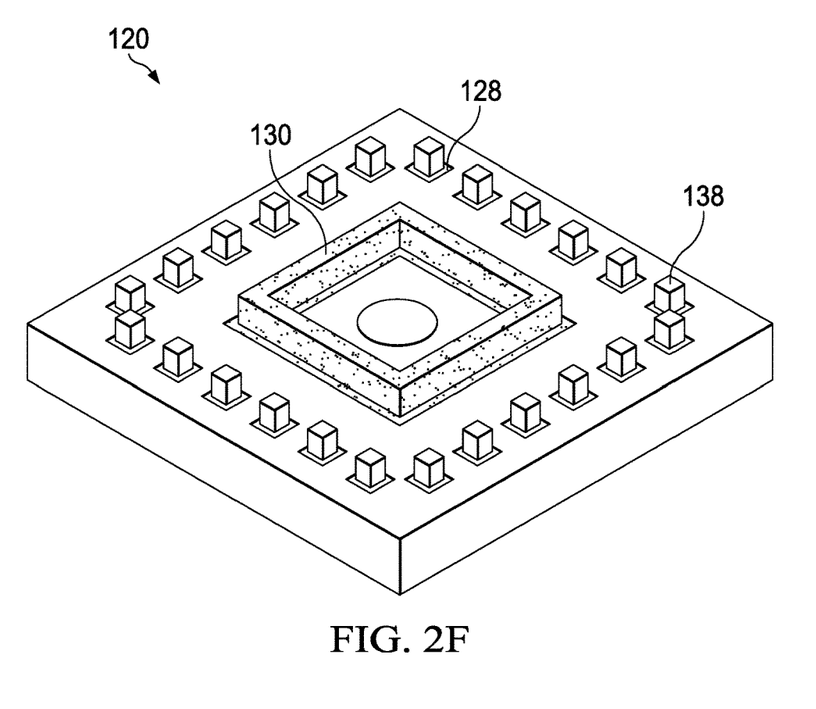

As shown in FIG. 2F, before or after forming the set of metal columns 130 about the perimeter of sensor 124, metal pillars 138 are built-up over terminals 128 to the same or similar height as the set of metal columns 130 above the active surface of semiconductor die 120. In some examples, metal pillars 138 may be patterned by plating multiple layers of metal over terminals 128 to build-up metal pillars 138 to a desired height. In other examples, metal pillars 138 may solid metal placed over terminals and soldered in place as described with respect to metal column base metal sections 134 or presoldered metal column sections 234. In such example, metal pillars 138 and individual metal column base metal sections 134 may be reflowed together to form soldered metal columns 130 in the perimeter around a sensor 124 and to electrically connect metal pillars 138 to die terminals 128.

Figure 2G:
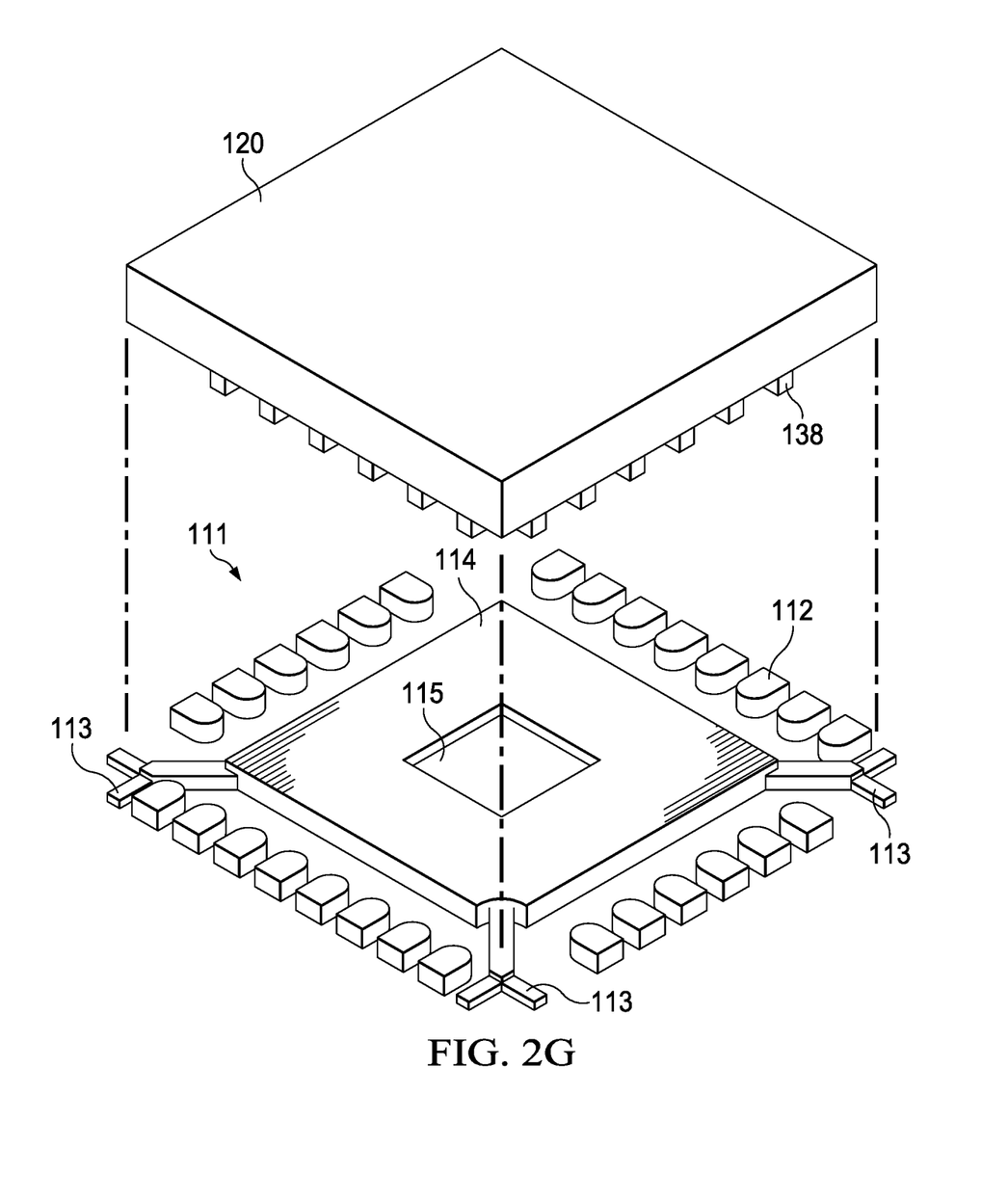

As shown in FIG. 2G, semiconductor die 120, including soldered metal columns 130 and metal pillars 138, is positioned on leadframe 111 such that the set of metal columns 130 extends between the semiconductor die 120 and the die pad 114 and metal pillars 138 extend between the semiconductor die 120 and the leads 112 (FIG. 4, step 204).

A solder layer on the topside of metal columns 130 is reflowed to connect metal columns 130 to die pad 114 about the perimeter of sensor 124. Likewise, a solder layer on the topside of metal pillars 138 is reflowed to electrically couple terminals 128 to leads 112 (FIG. 4, step 206). In some examples, plated or pasted solder 133 covers the topsides of metal columns 130 and/or metal pillars 138 to facilitate attachment to leadframe 111. In the same or different examples, a solder layer may be added, by plating or pasting for example, to the topsides of metal columns 130 and/or metal pillars 138 to facilitate attachment to leadframe 111. In addition or as an alternative to solder on the topsides of metal columns 130 and/or metal pillars 138, die pad 114 and/or leads 112 may include solder bumps to facilitate the mechanical and electrical attachment to metal columns 130 and metal pillars 138 respectively.

Metal columns 130 may optionally be electrically connected to a grounded electrical potential by way of their attachment to the metallization layer of semiconductor die 120. In such examples, die pad 114 is also electrically connected to the grounded electrical by way of attachment to the metal columns 130.

Figure 2H:
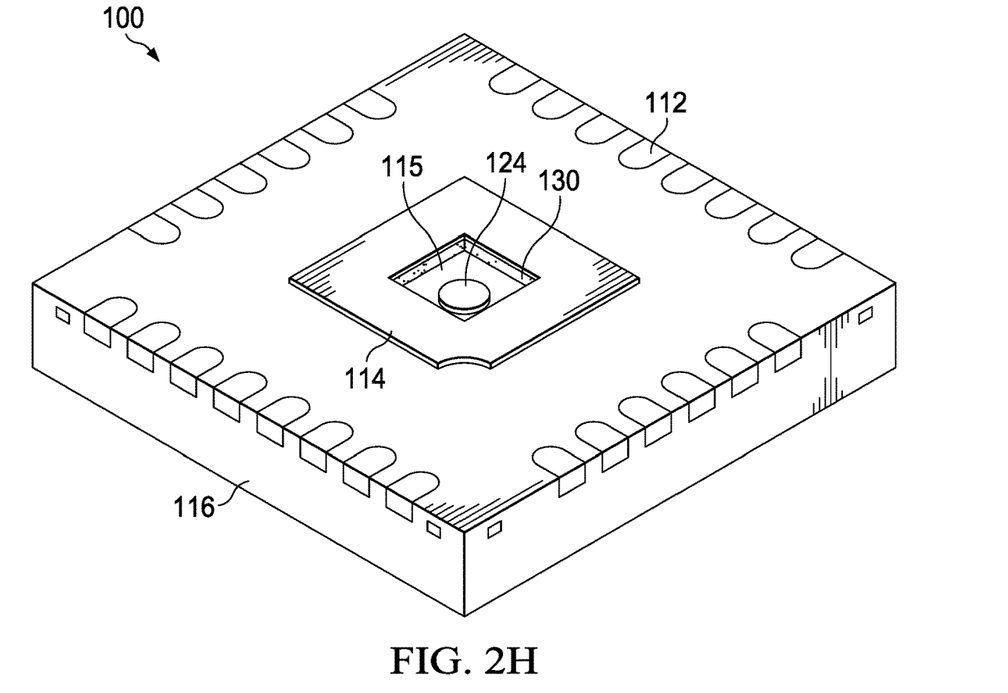

As represented by FIG. 2H, mold compound 116 deposited on the assembled device of FIG. 2G (FIG. 4, step 208). For example, mold compound 116 may be applied by paste printing, compressive molding, transfer molding, liquid encapsulant molding, vacuum lamination, spin coating, or other suitable technique. During the deposition of mold compound 116, soldered metal columns 130 block the flow of mold compound 116 from breaching the perimeter formed around sensor 124, and through hole 115 of die pad 114 includes leaves sensor 124 exposed to ambient air following the deposition of mold compound 116. In this manner, mold compound 116 covers semiconductor die 120 and metal pillars 138 except for an area inside the perimeter on the surface of the semiconductor die 120 such that the sensor 124 is exposed to ambient air.

In some examples, semiconductor package 100 may be one of an array of packages manufactured on an array of interconnected leadframes and molded in a batch process. In such examples, the method further includes singulating the array of molded packages to form individual semiconductor packages 100 (FIG. 4, step 210). Singulation may include cutting through leads 112, mold compound 116 and tie bars 113 (FIG. 2G) linking the interconnected leadframes with a saw or other cutting implement. The siderail and portions of tie bars 113 are removed during singulation. As package 100 is a leadless package, following singulation, the exposed end surfaces of leads 112 are coplanar with an outer side surface of mold compound 116. However, the specific package configuration is not germane to this disclosure, the applied techniques may be used in packages with any lead configuration, such as gull-wing packages, "J" leaded packages, and "I" leaded packages.

The specific techniques for semiconductor packages including a set of metal columns forming a perimeter around a sensor on the surface of a semiconductor die, including techniques described with respect to semiconductor package 100, are merely illustrative of the general inventive concepts included in this disclosure as defined by the following claims.

What is claimed is:

1. A method of forming a semiconductor package comprising:
    plating solder on a surface of a semiconductor die to form a perimeter around a sensor of the semiconductor die;
    placing a set of metal columns on the solder;
    reflowing the solder coating to solder the set of metal columns to the semiconductor die;
    electrically coupling terminals of the semiconductor die to a plurality of leads; and
    molding a mold compound over the semiconductor die except for an area inside the perimeter on the surface of the semiconductor die such that the sensor is exposed to ambient air.

2. The method of claim 1, wherein soldering the set of metal columns includes soldering four individual columns arranged end to end to form the perimeter on the surface of the semiconductor die.

3. The method of claim 1, wherein reflowing connects the metal columns end to end to close the perimeter.

4. The method of claim 1, further comprising positioning the semiconductor die with the metal columns on the surface of the semiconductor die on a die pad such that the set of metal columns extends between the semiconductor die and the die pad, wherein the die pad includes a through hole that accesses the sensor.

5. The method of claim 1, further comprising, after molding the mold compound over the semiconductor die, singulating the semiconductor package from a strip of semiconductor packages molded in a batch process.

6. The method of claim 1, wherein the semiconductor package is a leadless package.

7. A method of forming a semiconductor package comprising:
    placing a set of metal columns on a surface of a semiconductor die to form a perimeter around a sensor of the semiconductor die, the set of metal columns including a base metal section covered with solder;
    reflowing the solder to attach the set of metal columns to the semiconductor die;
    electrically coupling terminals of the semiconductor die to a plurality of leads; and
    molding a mold compound over the semiconductor die except for an area inside the perimeter on the surface of the semiconductor die such that the sensor is exposed to ambient air.

8. The method of claim 7, wherein reflowing the solder includes attaching the set of metal columns to each other.

9. The method of claim 8, wherein after reflowing solder is in between each of the set of metal columns.

10. The method of claim 7, further comprising, after molding the mold compound over the semiconductor die, singulating the semiconductor package from a strip of semiconductor packages molded in a batch process.

11. The semiconductor package of claim 7, wherein the sensor includes a humidity sensor.

12. The method of claim 7, wherein the semiconductor package is a leadless package.

13. The method of claim 7, wherein the base metal section includes one of copper, aluminum, iron, and gold.

14. The semiconductor package of claim 7, wherein the set of metal columns includes four columns arranged end to end to form the perimeter.

15. The semiconductor package of claim 7, wherein each of the set of metal columns includes a height and width of between 50-200 microns.

* * * * *